United States Patent [19]

Chesnoy

[11] Patent Number: 5,007,062
[45] Date of Patent: Apr. 9, 1991

[54] SEMICONDUCTOR LASER SOURCE MODULATED AT HIGH FREQUENCY

[75] Inventor: José Chesnoy, Paris, France

[73] Assignee: Alcatel N.V., Amsterdam, Netherlands

[21] Appl. No.: 403,745

[22] Filed: Sep. 6, 1989

[30] Foreign Application Priority Data

Sep. 8, 1988 [FR] France ............... 88 11741

[51] Int. Cl.$^5$ ............... H01S 3/10
[52] U.S. Cl. ............... 372/26; 372/50
[58] Field of Search ............... 372/26, 50

[56] References Cited

U.S. PATENT DOCUMENTS

| | | | |
|---|---|---|---|
| 4,719,636 | 1/1988 | Yamaguchi | 372/26 |
| 4,720,835 | 1/1988 | Akiba et al. | 372/26 |
| 4,852,108 | 7/1989 | Utaka et al. | 372/50 |

FOREIGN PATENT DOCUMENTS 189252 7/1986 European Pat. Off.

OTHER PUBLICATIONS

Korotky et al., "Optical Intensity Modulation to 40 GHz Using a Waveguide Electro-Optic Switch", *Appl. Phys. Lett.*, vol. 50, No. 23, pp. 1631–1633 (1987).
Goldberg et al., "35 GHz Microwave Signal Generation with an Injection-Locked Laser Diode", *Electronics Letters*, vol. 21, No. 18, pp. 814–815 (1985).
New: "The Generation of Ultrashort Laser Pulses", *Rep. Prog. Phys.* vol. 46, pp. 877–971 (1983).
Rush et al., "The Linewidth of a Mode-Locked Semiconductor Laser Caused by Spontaneous Emission . . . ", *IEEE Journal of Quantum Elec.*, vol. 32, No. 11, (1986).
Goodwin et al., "Modulation Detuning Characteristics of Actively Mode-Locked Diode Lasers", *IEEE Journal of Quantum Electronics*, vol. 19, No. 6 (1983).
Coldren et al., "Continuously-Tunable Single-Frequency Semiconductor Lasers", *IEEE Journal of Quantum Electronics*, vol. 23, No. 6 (1987).
"Passive and Active Mode Locking of a Semiconductor Laser Without an External Cavity", Applied Physics Letters, vol. 46, No. 12, 15 Jun. 1985, K. Y. Lau et al.
"Dispersion of the Group Velocity Refractive Index in GaAs Double Heterostructure Lasers", IEEE Journal of Quantum Electronics, vol. QE-19, No. 2, Feb. 1983, pp. 164–168, J. P. Van Der Ziel et al.
"Spectral Characteristics for a 1.5 μm DBR Laser with Frequency-Tuning Region", IEEE Journal of Quantum Electronics, vol. QE-23, No. 6, Jun. 1987, S. Murata et al., pp. 835–838.
"1.55 μm Wavelength Tunable FBH-DBR Laser", Electronic Letters, vol. 23, No. 7, 26 Mar. 1987, Y. Kotaki et al., pp. 325–327.
"Multielectrode Distributed Feedback Laser for Pure Frequency Modulation and Chirping Suppressed Amplitude Modulation", Journal of Lightwave Technology, vol. LT-5, No. 4, Apr. 1987, pp. 516–522, Y. Yoshikuni et al.
"Modelocking of Semiconductor Laser Diodes", Japanese Journal of Applied Physics, vol. 20, No. 6, Jun. 1981, pp. 1007–1020, H. A. Haus.
"Bandwidth-Limited Picosecond Pulse Generation in an Actively Mode-Locked GaAs Laser with Intracavity Chirp Compensation", Optics Letters, vol. 12, No. 5, May 1987, pp. 334–336, Optical Society of America, N.Y., J. Kuhl et al.
"Spectral Dependence of the Change in Refractive Index Due to Carrier Injection in GaAs Lasers", Journal of Appl. Phys., vol. 52, No. 7, Jul. 1981, C. H. Henry.

*Primary Examiner*—James W. Davie
*Attorney, Agent, or Firm*—Christie, Parker & Hale

[57] ABSTRACT

A semiconductor laser (2) constitutes a monolithic source whose intensity is modulated at a frequency lying in the microwave frequency range, typically 10–20 GHz to 100 GHz. It is based on coupling between the longitudinal modes of the laser, with intensity modulation being given by beats between the various modes of the laser. Optimization and control of the laser are made possible by splitting the optical cavity (6, 8, 10) of the laser into successive sections (20, 22, 24). The invention is particularly suitable for telecommunications applications.

13 Claims, 2 Drawing Sheets

SEMICONDUCTOR LASER SOURCE MODULATED AT HIGH FREQUENCY

The present invention relates to obtaining a light wave modulated at high frequency. Various sources are known for this purpose and the essential elements of one such source are listed to begin with. Some of these elements are common, at least in part, between said known source and a source in accordance with the present invention. These common elements are the following:

a monolithic plate having two opposite end faces, said plate being made of a semiconductor material with different doping and having a refractive index including a local low in order to guide light waves along the length of a light channel extending between the two said end faces;

amplification injection means for injecting DC bias current ($I_p$) into said plate to give rise to population inversion in said light channel so as to amplify said light waves therein, the gain representative of the possible amplification of a wave being positive only if the frequency of said wave lies in a gain spectrum range having a gain spectrum width;

two reflectors together constituting an optical cavity including said light channel and having an optical cavity length L such that said cavity is resonant in a succession of modes for light waves having a corresponding succession of resonant frequencies, said frequencies being separated at intervals equal to an intermode frequency $$f_i = c/2L$$

where c is the speed of light, in such a manner that such cavity constitutes a laser oscillator capable of producing light waves at frequencies close to those of said resonant frequencies which are situated in said gain spectrum range, and such that mode coupling is possible between the resulting waves; and modulation injection means (CM) for injecting an AC modulation current ($I_{HF}$) into said plate, said current having a modulation frequency ($f_m$) and likewise passing through said light channel in order to cause an alternating gain component to appear therein, said modulation frequency being close to said intermode frequency in order to impose one of said mode couplings thereto whereby said oscillator produces said light waves in the form of a modulated carrier wave (OP), with at least one modulation component of said wave constituting an output modulation signal having said modulation frequency.

This first prior source is described in an article by J. P. van der Ziel, published in Semiconductors and Semimetals, Vol. 22 B, p. 1, 1985, Academic Press. Its optical cavity is essentially outside the semiconductor plate. It provides short duration light pulses (duration of the order of a few picoseconds) at a repetition rate which is typically 100 MHz and which has reached 9.4 GHz. At rates of more than about 1 GHz the carrier wave coherence obtained is poor and this limits the maximum rate to about 10 GHz. At lower rates, the modulated carrier wave conveys low power only in each of the numerous modulation spectrum lines that it includes.

There are other known ways of providing a semiconductor laser source which is modulated at high frequency.

One possibility is offered by direct modulation of the laser: the power of the modulation current is selected to be sufficient to serve on its own to obtain the desired modulation of the light wave without assistance from the phenomenon of mode coupling. In addition to other drawbacks, the frequencies that are made accessible by means of a source constituted in this way are limited by the frequency of relaxation oscillations, i.e. to about 10 GHz for presently available semiconductor lasers and probably to a maximum of 20 GHz in the future (G. P. Agrawal and N. K. Dutta, Long Wavelength Semiconductor Lasers, Van Nostrand, 1986).

Another possibility is offered by external modulators for which passbands are reaching 40 GHz at present (K. Uhde, Electronic Letters, No. 23, p. 1156, 1987).

Another known possibility consists in obtaining beats between two lasers at different frequencies or between two modes in a single laser. This possibility has been applied to semiconductor lasers by means of a modulated "master" laser injecting "slave" lasers (L. Goldberg, A. M. Yurek, J. F. Weller and H. F. Taylor, Electronic Letters No. 21, p. 814, 1985). It is difficult to implement and does not appear to lend itself easily to integration.

However, such integration in the form of a monolithic laser oscillator appears to be desirable when the source to be made is to constitute a component in a system such as a telecommunications system, for example.

That is why most coupling has been obtained in a short cavity monolithic semiconductor laser by current injection (K. Y. Lau, I. Ury and A. Yariv, Appl. Phys. Lett. No. 46, p. 1117, 1985). However, the coupling has been partial only and components made in this way have not been suitable for defining the phase of the output modulated signal, nor for obtaining highly coherent optical emission for use as a carrier wave. Even though the authors used very large modulation currents, they did not achieve complete mode coupling. As a result, this component has not been considered as being suitable for constituting a modulatable light source.

A final known possibility is given by generating picosecond light pulses that occupy a wide frequency range by virtue of the short duration of the pulses. These pulses may be obtained by gain switching (K. Y. Lau and A. Yariv, Semiconductors and Semimetals, Vol. 22, B, p. 69, 1985, Academic Press), or by coupling longitudinal modes in an external cavity, as in said first-mentioned prior source. In either case, as mentioned above, since the pulse repetition rate is low, the energy transported in a narrow frequency band is also low.

The present invention has the following aims in particular with respect to modulating an optical carrier wave:

raising the modulation frequency within the microwave region;

providing modulation that transports a majority fraction of its power in a very narrow band, i.e. in the form of a fundamental wave which may itself be modulated but at a much lower frequency, with the harmonics of said fundamental wave transporting only a small portion of the power, and preferably less than 20%;

reducing the modulation current, preferably to well below 50% of the bias current;

when the two preceding aims are not useful and when a large modulation current may be used, providing modulation in the form of pulses that follow one another at an increased rate;

modulating the output modulated signal itself in amplitude and/or phase and/or frequency; and providing modulation by means of a source which is monolithic and compact.

A laser source according to the present invention includes, in monolithic manner and between two reflectors, a modulation section coupled to a waveguide section, preferably with additional filtering, and it is controlled by a D.C. bias current and by a smaller-amplitude microwave frequency modulation current.

More particularly, the invention provides a source including the above-mentioned common elements, said source being characterized relative to the first above-mentioned prior source by the facts that said plate carries said reflectors on its said end faces in such a manner that the optical length of the cavity L is limited by the length of said light channel to situate said intermode frequency ($f_i$) and consequently also to limit said modulation frequency ($f_m$) in the microwave frequency range, said modulation signal constituting an output microwave frequency signal (SHF);

said plate also includes dispersion limitation means disposed in said optical cavity to limit the group propagation time dispersion of said light waves in said cavity; and an additional filter is included in said optical cavity so that said laser oscillator can produce said light waves only within a filtering spectrum range having a filtering width which is less than half said gain spectrum width while still being greater than said intermode frequency, thereby avoiding frequency instabilities in said waves produced by said laser oscillator; and said gain modulation is performed solely in a section of the length of said light channel, said section constituting a gain modulation section and extending over a minority fraction of said length at one end thereof, in such a manner as to impose a predetermined phase to said output microwave frequency signal relative to said modulation current.

According to the present invention, the following sometimes-preferred dispositions may also be adopted:

said amplification injection means limit said population inversion and said amplification of light waves to a gain section of said light channel, said section simultaneously constituting said gain modulation section and its optical length occupying a fraction which is less than one fourth of said optical length of the cavity. The remainder of the length of the cavity may then constitute a passive waveguide section in which the material inside the guiding channel is intrinsically transparent. However, it may be observed that such a passive waveguide section could be replaced by a neutral waveguide section in which the material is not intrinsically transparent and is interposed between opposite conductivity type semiconductor layers in such a manner as to make gain possible, but which passes a current selected to ensure that it has no gain.

Said filtering width lies between twice and 100 times said intermode frequency ($f_i$) such that said mode coupling takes place over a plurality of longitudinal modes.

Said additional filter is a distributed Bragg reflector occupying a filtering section at one end of said optical cavity. Such a reflector is known internationally by the abbreviation DBR which stands for "Distributed Bragg Reflector". It makes it possible to narrow the filtering width to a value of about 1 nanometer, thereby obtaining a component with a large dynamic range (i.e. capable of providing large variations in the modulated optical power). The spectrum width of the DBR filter must nevertheless remain wide enough relative to $f_m$ to avoid requiring too high a current $I_{HF}$ (which requires high coupling coefficients K to be obtained of about 100 or 200 cm$^{-1}$). Although it would appear not to be preferable, this filter could be constituted differently, in particular by a stack of dielectric layers constituting one of said reflectors at one of the ends of said optical cavity.

Said filtering spectrum range is selected to coincide with a frequency range in which a dispersion parameter has a negative value in said gain section whereas it has a positive value in said waveguide section, the absolute value of said negative value being greater than three times said positive value, said parameter being the second derivative ($d^2n/d.lambda^2$) of the refractive index (n) in said light channel relative to the wavelength (lambda) of said light waves, thereby compensating the dispersion to constitute said dispersion limitation means. However, more generally, said compensation may be achieved by the fact that the length of said cavity includes sections having dispersion values of opposite signs, said values being representative of the dispersion in the group propagation speeds of said light waves in respective ones of said sections.

Finally, it is preferable for at least one of said two reflectors to be semitransparent in order to allow an outlet wave to leave constituted by said carrier wave (OP) modulated by said output microwave frequency signal (SHF).

The above dispositions make it possible to provide a laser source which is modulated in the microwave frequency range by mode coupling in a cavity of length in the millimeter range, and in which the various operating parameters are decoupled by the resonant cavity being constructed in the form of successive sections. Compared with prior sources, the modulation frequencies are no longer limited by relaxation oscillations (unlike direct modulation), and the output modulation energy is essentially transported at the modulation frequency (unlike cases where the output wave is constituted by a succession of short pulses at a low repetition rate).

Such a source is particularly suitable for constituting a component in a telecommunications system.

The operating conditions of such a component are now specified. As mentioned above, this operation is based on longitudinal mode coupling (G. H. C. New, Rep. Prog. Phys. No. 46, p. 877, 1983) in a semiconductor laser source having an extended resonant cavity, said coupling being obtained by gain modulation at a frequency $f_m$ which is close to the intermode frequency specific to the cavity. The gain modulation is obtained by injecting a sinewave current $I_{HF}$ at the frequency $f_m$, superposed on a D.C. bias current $I_p$ placing the laser above its oscillation threshold. The frequency $f_m$ is given by the time taken by light to travel back and forth over the optical length L of the extended cavity:

$$1/f_m = 2L/c$$

where c is the speed of light in a vacuum and where the length L takes account of the group index of each of the sections of the extended cavity. For a mean index n = 4, a frequency $f_m$ of 20 GHz is obtained using a cavity of length L close to 1.9 mm, and a frequency of 100 GHz is obtained with a length L close to 0.37 mm.

The light emission from this component is constituted by a light beam which is modulated in intensity at the frequency $f_m$. The mean power depends approximately linearly on the bias current $I_p$, and is close to the power that would be obtained if there were no modulation current.

The modulation depth (the power component at the frequency $f_m$, said component being compared with the mean total power) depends approximately linearly on the modulation current $I_{HF}$. Sinewave modulation at the frequency $f_m$ is obtained by coupling between a few modes in the laser cavity. In this type of operation, the intensity modulation is due to the superposition of laser emission over several modes and may take place at frequencies which are much higher than the frequency of relaxation oscillations, said frequencies being limited solely by the gain width and the efficiency of gain modulation (giving a maximum likely value around $f_m = 100$ GHz). The optical modulation (i.e. modulation of said carrier wave) is formed over a large number of light go and return trips through the component (typically 100 to 1000). This gives rise to good spectrum coherence in the optical emission (i.e. in said carrier wave), with said coherence being close to that which would be obtained during single frequency operation of the same laser component (D. W. Rush, G. L. Burdge and P. T. Ho, IEEE J. Quant. Elec. Q. E. 22, p. 2088, 1986).

The important points for obtaining good operation of this component are specified below. In manufacture and use, help may nevertheless be obtained from certain results that have been previously obtained experimentally and theoretically and which relate to mode coupling in a laser source by injecting current into a semiconductor laser placed in an external cavity (H. A. Haus, Jpn J. Appl. Phys. No. 20, p. 1007, 1981).

The gain modulation section must be formed at one end of the component in order to fix the phase of light intensity modulation relative to the phase of the modulation current $I_{HF}$. It must be short in length relative to the total optical length of the laser resonant cavity so that the gain modulation imposed by said current is limited to an accurate time fraction of the light intensity traveling along said cavity. In addition, the short length of the gain section which coincides with said gain modulation section also limits a known unfavorable effect constituted by spectral destabilization of the gain. This effect is due to local shortages of excited quantum states suitable for amplifying said light waves. These shortages are localized in the antinodes of the optical standing wave oscillating in the resonant cavity and are known internationally under the term "spatial hole burning".

The cavity must be extended by a waveguide section so that its length determines the modulation frequency $f_m$. It is important for the optical coupling between successive sections to avoid being disturbed by interfering retro reflection. Structures are therefore selected which enable good optical impedance matching to be obtained with retro reflection limited to one or a few percent at most.

The optical spectrum width permitted by the cavity (said width being the width containing all of the said permitted frequencies and being given by the gain curve and by the additional filtering) must be greater (in frequency) than $f_m$, the limiting width on the emitted light wave. The current $I_{HF}$ required for obtaining given modulation in a given cavity is inversely proportional to said spectrum width. Greater sensitivity to modulation control is thus obtained by increasing the spectrum width permitted by the cavity. However, too great a permitted spectrum width gives rise to destabilization of the optical emission, mainly because of gain saturation (spectrum, space, and time saturation). Thus, the natural gain width of semiconductor laser sources presently available does not make it possible to obtain an emission with good coherence under the conditions mentioned above. Limited additional filtering makes it possible to obtain a component which is sensitive (controlled by a current $I_{HF}$ of about a milliamp), but which is fragile relative to changes in external conditions, and which thus has a small dynamic range. Narrow filtering (a few times $f_m$) gives a component which is less sensitive (required $I_{HF}$ about 10 milliamps), but more robust in the face of external disturbances, and thus having a larger dynamic range in operation. Filtering may be obtained by depositing a multidielectric filter on one of the faces of the components. However this type of filter seems to be insufficiently selective. More selective filtering is obtained by adding a distributed Bragg reflector DBR to the waveguide. Here again it is appropriate to have good optical matching with the remainder of the waveguide section and also to take account of the grating in the DBR reflector when calculating the optical length of the resonant cavity.

An important parameter which determines the efficiency of the modulation by the current $I_{HF}$, is the group propagation time dispersion within the component. The value of this dispersion may be calculated by integrating said dispersion parameter over the geometrical length of the cavity. Typical values of the dispersion in semiconductors considerably reduce the efficiency of light modulation compared with that which would be possible with no dispersion. If it is desired that the component should be controllable by means of a low current $I_{HF}$ (a few milliamps), then the group propagation time dispersion should be adjusted to a value close to zero. This possibility is provided by having a range of high "abnormal" dispersion on the high frequency side of the gain curve (gain as a function of frequency), in which said parameter is negative (J. P. van der Ziel and R. A. Logan, IEEE J. Quant. Elec. QE 19, p. 164, 1984). The absolute value of this "abnormal" dispersion is sufficient to compensate for the "normal" dispersion of the other sections in which the same parameter is positive, providing, naturally, that the relative lengths of the various sections are properly adjusted. In order to obtain such compensation, the frequency range of the additional filter should be placed as far as possible in the abnormal dispersion range. This spectrum position of the filter on the high frequency side of the gain curve also improves modulation efficiency by increasing differential gain (C. H. Henry, R. A. Logan and K. A. Bertness, J. Appl. Phys. No. 52, p. 4457, 1981).

Amplitude modulation of the optical emission can be obtained by controlling the bias current.

An optical length mismatch may be tolerated so long as it does not exceed a relative value of $10^{-2}$ or $10^{-3}$ (as for external cavity lasers: J. C. Goodwin and B. K. Garside, IEEE J. Quant. Elec. QE 19, p. 1068, 1983). This frequency mismatch shifts the phase of the output microwave frequency signal relative to the modulation current and gives rise to the possibility of said signal being phase modulated.

The passbands of the microwave frequency phase or amplitude modulation are limited by the mode coupling construction time to $10^{-2}f_m$ or $10^{-3}f_m$. They are approximately proportional to $I_{HF}$. At most they amount to a few hundreds of megahertz.

The conversion of electron energy into optical energy is improved by matching the electrical impedance of the modulation current $I_{HF}$ (this matching only needs to be performed over a narrow band).

The semiconductor structure of the source of the invention may be of the same type as for sources described for providing tunable monomode lasers (L. A. Coldren and S. W. Scott, IEEE J. Quant. Elec. QE 23, p. 903, 1987). Since the electrical and optical properties of prior semiconductor laser sources are close, the constituent material may be selected as a function of the desired optical wavelength and it is possible to implement mode coupling on lasers constituted by GaAs or InP, for example.

It may also be observed that dispersion compensation has already been described, but for lasers having an external cavity, i.e. operating at modulation frequencies which are very far removed from those under consideration herein (J. Kuhl, M. Serenyi, E. O. Gobel, Optics Letters, 12, p. 334, 1987). In addition, the means used were very different.

The component constituted as mentioned above may be modulated by acting on various controllable magnitudes: the bias current $I_p$; the modulation current $I_{HF}$; and possibly signals acting on the length of the cavity L and on the central frequency of the additional filter. Various devices may be made by association with other items such as an optical detector or an optical fiber.

An advantage of this component is that it is controllable in amplitude and in phase by currents which are modulatable at a frequency which is much lower than the frequency of the resulting output microwave frequency signal, with the current $I_{HF}$ preferably remaining constant. Another feature of this component is that it constitutes a high frequency source having a narrow spectrum band width.

However, in some cases it may be advantageous to use this component in a different manner. The modulation current ($I_{HF}$) is then chosen to be large enough to cause said output wave to include modulation components which constitute harmonics at frequencies which are multiples of said modulation frequency ($f_m$) so as to constitute a source of light pulses at a high repetition rate.

An implementation of the present invention as set out above is described below in greater detail by way of non-limiting example and with reference to the accompanying diagrammatic figures. When the same item appears in several figures it is designated in all of them by the same reference symbol. The implementations described include the dispositions mentioned above as being preferred in accordance with the invention. It should be understood that the items specified may be replaced by other items which perform the same technical functions.

Figure 4:
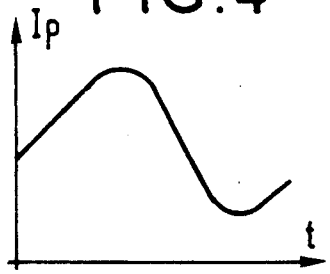
Figure 7:
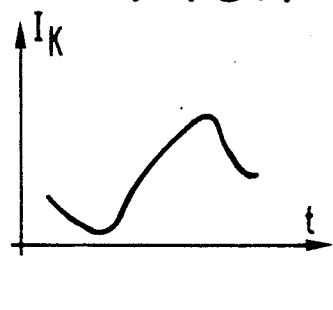
Figure 10:
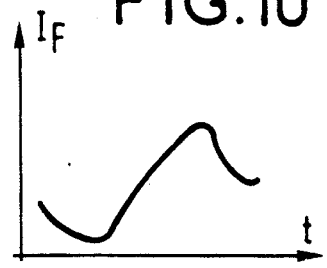

FIGS. 4, 7, and 10 show control currents applied to said source for various applications thereof.

FIGS. 5, 8, 11, and 13 show the source in various different applications.

FIGS. 6, 9, 12, and 14 show the output signals or waves from said source in said various applications.

Figure 1:
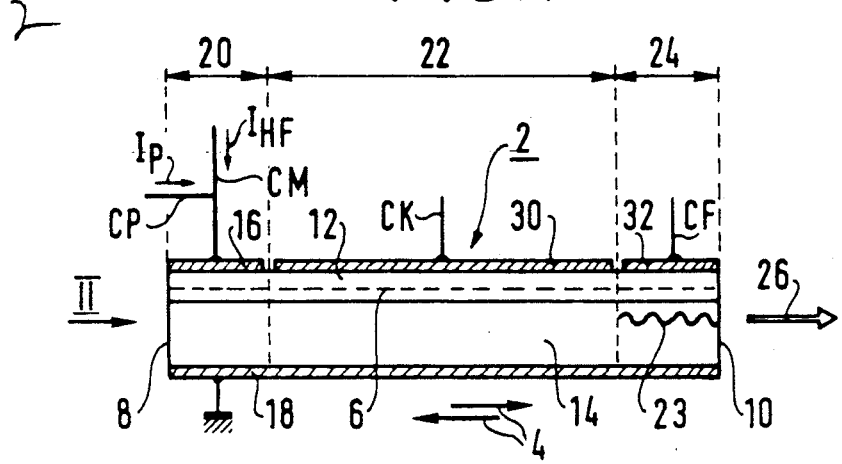
FIG. 1 is a side view of a source in accordance with the invention.
Figure 2:
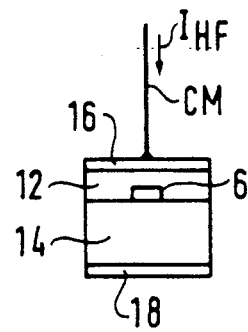
FIG. 2 is a cross-section through said source.

In FIGS. 1 and 2, said semiconductor plate is referenced 2 and constitutes a laser diode whose length runs along a longitudinal direction represented by a pair of arrows 4. A longitudinal light channel is referenced 6. The end faces 8 and 10 of said plate constitute the reflectors at the ends of the optical cavity constituted by said channel. Two opposite conductivity type layers 12 and 14 are formed above and below a gain section of said channel in order to enable a bias current to set up a population inversion in said section. The internal structure of the diode constituted by the plate is in fact more complex than that, in conventional manner for making semiconductor laser diodes.

Modulation and amplification injection means are represented by two conductors CM and CP. They inject modulation current $I_{HF}$ and bias current $I_p$ via a localized electrode 16 and an overall electrode 18 which may be connected to ground.

The gain section 20 extends facing the electrode 16. The filtering section is referenced 24 with the additional filter being referenced 33. Together with said filtering section, the remaining intermediate section 22 constitutes the above-mentioned waveguide section.

Figure 3:
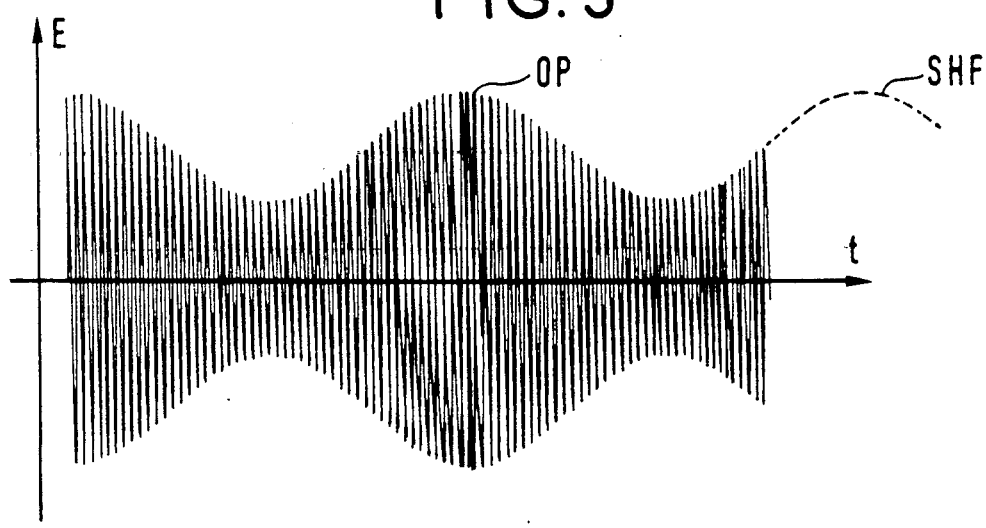
FIG. 3 is a diagram showing the waveform of an output wave emitted by said source.

The output wave is represented by an arrow 26. As shown in FIG. 3, it comprises a carrier wave at an optical frequency OP which is amplitude modulated by a microwave frequency signal SHF, with the figure having time t plotted along the X axis and electric field E plotted up the Y axis.

The component made in this way constitutes a microwave frequency amplifier and/or converter since it provides an optical microwave frequency signal at a power comparable to or greater than the power of the electrical modulation current $I_{HF}$ which it receives as an input at the same frequency.

In accordance with a sometimes preferred disposition of the invention, the amplification injection means CP enables the bias current Ip to be controlled at low frequency in such a manner as to provide low frequency modulation of the output wave carrying the output microwave frequency signal AHF. In this way, an amplitude modulator is provided for said output wave and for said microwave frequency signal.

The component used to do this is the component as described above except that the bias current Ip varies as shown in FIG. 4. This component is shown symbolically in FIG. 5, and the output microwave frequency signal is shown at AHF in FIG. 6.

Figure 5:
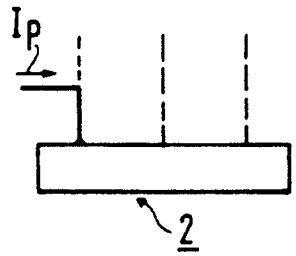
Figure 6:
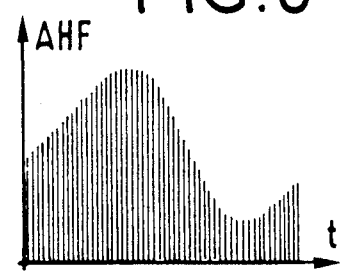

In FIG. 5, as in the following figures which symbolize the components of the invention, heavy lines represent the conductors whereby control current is conveyed. Such a current passes through one of the three sections such as 20, 22, and 24 if need be via one of additional electrodes 30 and 32 which are disposed on the intermediate section 22 and the filtering section 24 and which bear conductors CK or CF, respectively.

Variation in the bias current Ip does not only change the gain. It also gives rise to a change in the refractive index and therefore in the optical wavelength of the gain section. That is why the source may also include optical wavelength variation compensation means for injecting a compensation current of length $I_K$ in a phase modulation section 22 and for varying this compensation current simultaneously with said bias current so as to prevent said intermode frequency $I_f$ drifting. Such compensation means is pointless if the looked-for aim is to vary the phase of the output microwave frequency signal.

Figure 8:
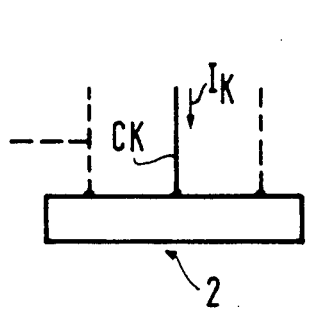
Figure 9:
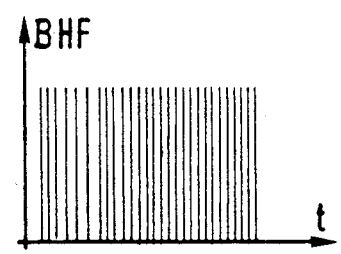

In another sometimes-preferred disposition, as shown in FIGS. 7 and 8, the source also includes phase modulation means receiving a phase modulation signal at low frequency ($I_K$) and controlling the cavity length L in a corresponding manner so as to modulate the phase of a microwave frequency output signal BHF shown highly symbolically in FIG. 9. In accordance with another preferred disposition, this phase modulation means comprises:

- a phase modulation section (constituted by the intermediate section 22) extending over at least a fraction of said cavity length, with the refractive index in said guidance channel 6 in said section being sensitive to the density of charge carriers; and
- a phase modulation injection means (constituted by the conductor CK) for injecting a phase modulation electrical current $I_K$ through said channel in said section in such a manner as to control the density of charge carriers therein, said current constituting said phase modulation signal.

It may, however, be observed that the length of the phase modulation section may also be tuned by the electro-optical effect which is quicker than control by carrier injection.

Figure 11:
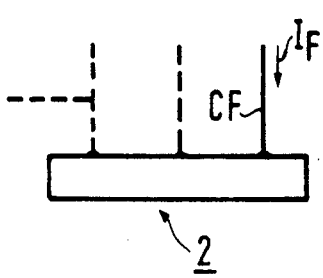

Another sometimes-preferred disposition is illustrated by FIGS. 10 and 11. It is applicable when the additional filter 23 is a distributed Bragg reflector occupying the filtering section 22 at one end of the optical cavity 6, 8, and 10, and the refractive index in the guidance channel 6 in said section is sensitive to the density of charge carriers.

Figure 12:
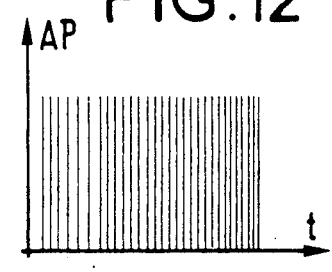

In this disposition, the source includes frequency modulation injection means (constituted by the conductor CF) for injecting a frequency modulation current $I_f$ through said channel in said section in such a manner as to control the charge carrier density therein so as to modulate the frequency of the carrier wave AP in this way as shown highly diagrammatically in FIG. 12.

Figure 13:
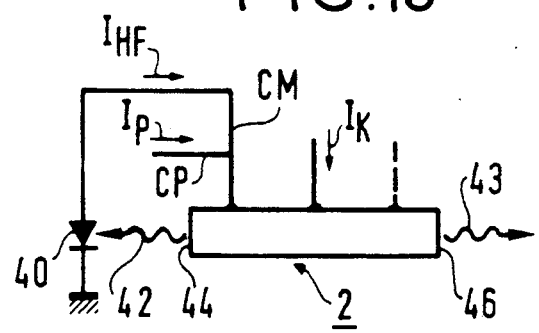
Figure 14:
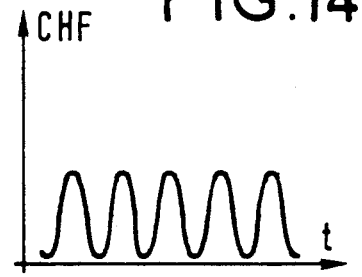

In accordance with another sometimes-preferred disposition illustrated by FIGS. 13 and 14, the source further includes:

- a photodetector 40 for receiving an output wave and for responding by providing a detection current representative of the output microwave frequency signal CHF carried by said wave; and
- link means (constituted by the conductor CM which may be provided with an amplifier, not shown) for generating the modulation current $I_{HF}$ from said detection current, in such a manner as to cause said source to constitute a microwave frequency oscillator.

In the example shown, two output optical waves leave simultaneously from the source via two reflectors 44 and 46 which replace the reflectors 8 and 10, with one of the waves 42 being directed towards the photodetector 40 which may be a photosensitive diode, for example, while the other wave 43 constitutes an output wave from the microwave frequency oscillator. The frequency of the wave 43 may be controlled by a frequency modulation current which is applied and which acts in the same way as the above-mentioned phase modulation current. The modulation current is constituted by the detection current, after possible amplification and/or filtering and/or phase correction.

I claim:

1. A semiconductor laser source modulated at high frequency, comprising:

a monolithic plate having two opposite end faces, said plate being made of a selectively doped semiconductor material defining two opposing bias layers of different conductivity types and a light channel between said layers and extending between the two said end faces having a refractive index lower than that of the surrounding semiconductor material in order to guide light waves along the length of said light channel;

amplification injection means for injecting DC bias current into said plate to give rise to population inversion in said light channel so as to amplify said light waves therein with a possible positive overall amplification, lightwaves lie in a predetermined gain spectrum range having a predetermined gain spectrum width;

two reflectors each carried on a respective one of said two end faces at a respective end of said light channel for defining an optical cavity including said light channel and having an optical cavity length L such that said cavity is resonant in a succession of modes for light waves having a corresponding succession of resonant frequencies, said frequencies being separated at intervals equal to an intermode frequency $$f_i = c/2L$$

where c is the speed of light, such that such cavity constitutes a laser oscillator for producing light waves at frequencies close to those of said resonant frequencies which lie within said gain spectrum range, the optical length of the cavity L being limited by the length of said light channel to a value corresponding to a intermode frequency in the microwave range;

modulation injection means for injecting an AC modulation current having a predetermined modulation frequency through a gain modulation section of said light channel located at one end thereof and extending over a minority fraction of the length of said light channel, in order to cause an alternating gain component to appear therein, said modulation frequency being close to said intermode frequency in order to produce said light waves in the form of a modulated carrier wave with at least one modulation component of said wave constituting an output modulation signal having said predetermined modulation frequency and lying in the microwave frequency range whereby said modulation signal constitutes a microwave frequency output signal;

dispersion limitation means disposed in said optical cavity to limit the group propagation time dispersion of said light waves in said cavity; and a filter in said optical cavity so that said laser oscillator can produce said light waves only within a filtering spectrum range having an associated filtering width which is less than half said gain spectrum width while still being greater than said intermode frequency, thereby avoiding frequency instabilities in said waves produced by said laser oscillator;

wherein said gain modulation imposes a predetermined phase to said output microwave frequency signal relative to said modulation current.

2. A source according to claim 1, wherein said amplification injection means limits said population inversion and said amplification of light waves to a gain amplification section of said light channel, said gain amplification section simultaneously constituting said gain modulation section and its optical length occupying a fraction which is less than one fourth of said optical length of the cavity, the remaining fraction of the length of said channel constituting a wave guide section.

3. A source according to claim 1, wherein said filtering width lies between twice and 100 times said intermode frequency such that said mode coupling takes place over a plurality of longitudinal modes.

4. A source according to claim 1, wherein said filter is a distributed Bragg reflector occupying a filtering section at one end of said optical cavity.

5. A source according to claim 1, wherein said light channel further comprises a second section which follows said gain amplification section, with the successive sections having dispersion values of opposite sign, said dispersion values being representative of the group propagation velocity dispersion of said light waves in said respective ones of said sections such that the interaction of said sections compensates the dispersions in order to constitute said dispersion limitation means.

6. A source according to claim 2, wherein said filtering spectrum range coincides with a frequency range in which a dispersion parameter has a negative value in said gain amplification/gain modulation section whereas it has a positive value in said waveguide section, the absolute value of said negative value being greater than three times said positive value, said parameter being the second derivative of the refractive index in said light channel relative to the wavelength of said light waves, thereby compensating the dispersion, whereby the two sections of said light channel cooperatively function as said dispersion limitation means.

7. A source according to claim 1 in which at least one of said two reflectors is semitransparent in order to allow an outlet wave to leave, said output wave being constituted by said carrier wave modulated by said output microwave frequency signal.

8. A source according to claim 7, wherein said amplification injection means provides low frequency control of said bias current, thereby enabling said output wave carrying said output microwave frequency signal to be amplitude modulated at low frequency, said source also including means for compensating optical length variation in order to inject a length compensating current into a phase modulation section, and in order to vary said compensation current simultaneously with said bias current so as to prevent said intermode frequency drifting.

9. A source according to claim 7, wherein said amplification injection means serves to vary said bias current in such a manner as to vary said intermode frequency so as to vary the phase of said output microwave frequency signal, said variation being accompanied by variation in the amplitude of said signal-carrying output wave.

10. A source according to claim 7, wherein it further includes phase modulation means receiving a low frequency phase modulation signal and controlling said cavity optical length in corresponding manner so as to modulate the phase of said output microwave frequency signal.

11. A source according to claim 10, wherein said phase modulation means further comprises:
a phase modulation section extending over at least a fraction of the length of said light channel with the refractive index in said channel in said phase modulation section being sensitive to the charge carrier density; and
phase modulation injection means for injecting a phase modulation electrical current through said channel in said modulation section in such a manner as to control the charge carrier density therein, said current constituting said phase modulation signal.

12. A source according to claim 7, wherein
said filter is a distributed Bragg reflector occupying a filtering section at one end of said light channel, the refractive index in said channel in said filtering section being sensitive to the charge carrier density; and
said source further comprises
frequency modulation injection means for injecting a frequency modulation current through said channel in said filtering section in such a manner as to control the charge carrier density therein, thereby modulating the optical frequency of said carrier wave.

13. A source according to claim 7, further comprising:
a photodetector for receiving said output wave and for responding by providing a detection current representative of said output microwave frequency signal carried by said wave; and
link means for generating said modulation current from said detection current, in such a manner that said source constitutes a microwave frequency oscillator.

* * * * *